United States Patent
Thakur et al.

(10) Patent No.: US 6,592,661 B1
(45) Date of Patent: Jul. 15, 2003

(54) METHOD FOR PROCESSING WAFERS IN A SEMICONDUCTOR FABRICATION SYSTEM

(75) Inventors: Randhir P. S. Thakur, Boise, ID (US); Ronald A. Weimer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 660 days.

(21) Appl. No.: 09/028,979

(22) Filed: Feb. 25, 1998

(51) Int. Cl.[7] .................................................. C30B 1/02
(52) U.S. Cl. ..................... 117/2; 117/3; 117/84; 117/95; 117/103; 117/105; 427/248.1; 427/255.2
(58) Field of Search ................................ 117/23, 84, 95, 117/103, 105; 427/248.1, 255.2

(56) References Cited

U.S. PATENT DOCUMENTS

| | | | |
|---|---|---|---|
| 4,846,102 A | * | 7/1989 | Ozias ........................ 118/730 |
| 4,874,464 A | * | 10/1989 | Goodwin et al. |
| 5,350,236 A | | 9/1994 | Thakur et al. |
| 5,418,885 A | | 5/1995 | Hauser et al. |
| 5,444,217 A | | 8/1995 | Moore et al. |
| 5,493,987 A | | 2/1996 | McDiarmid et al. |
| 5,494,494 A | | 2/1996 | Mizuno et al. |
| 5,561,612 A | | 10/1996 | Thakur |
| 5,580,388 A | | 12/1996 | Moore |
| 5,601,366 A | | 2/1997 | Paranjpe |
| 5,628,564 A | | 5/1997 | Nenyei et al. |
| 5,634,974 A | | 6/1997 | Weimer et al. |

OTHER PUBLICATIONS

Van Zant, Peter; *Microchip Fabrication: A Practical Guide to Semiconductor Processing*; pp. 166–170; 473–474.

* cited by examiner

*Primary Examiner*—Robert Kunemund
(74) *Attorney, Agent, or Firm*—Killworth, Gottman, Hagan & Schaeff, L.L.P.

(57) ABSTRACT

A method of manufacturing semiconductor wafers in a processing chamber having at least one radiant heat source is provided. The method includes the steps of applying a predetermined amount of power to the radiant heat source and positioning a wafer within the processing chamber. The predetermined amount of power applied to the at least one radiant heat source is set such that the wafer reaches a predetermined temperature in a predetermined amount of time for carrying out a desired process in the processing chamber. The processing chamber is particularly suited for very low pressure environments and may be used to form HSG in a clustered or non-clustered system. A reflective plate may be used so that the radiated properties of the wafer are substantially independent of the emissivity of the wafer thereby minimizing emissivity variation from one wafer to another. Another plate may be used to form an isothermal cavity between the plate and the wafer to minimize emissivity variation from one wafer to another.

76 Claims, 2 Drawing Sheets

METHOD FOR PROCESSING WAFERS IN A SEMICONDUCTOR FABRICATION SYSTEM

BACKGROUND OF THE INVENTION

The present invention relates in general to thermal processing systems, and, more particularly, to a method for processing semiconductor devices using rapid thermal processing systems.

Rapid Thermal Processing (RTP) was started as a research technique over 25 years ago using pulsed laser beams. As the semiconductor industry is moving towards submicron devices, RTP is becoming a core technology step in the development and mass production of ultra-large system integration (ULSI) devices. RTP processors attain a desired processing temperature rapidly, without the need for a lengthy "ramp up" period. This quick ramp up minimizes the thermal budget and the total time of the process thereby allowing more dense designs and fewer failures from internal crystalline dislocations. Thus, RTP processors allow microelectronic devices to be fabricated at high temperatures without causing dopant diffusion or other unwanted side effects. Since RTP processors typically process semiconductor wafers, the term "wafer" will be used herein to designate any device, material or substrate processed in the RTP processor.

In contrast.with a conventional furnace which typically uses resistive heating units, an RTP processor typically uses radiant heat sources, for example, arc lamps or tungsten-halogen lamps. A small processing chamber is typically used, to provide a controlled environment for the wafer to be processed and to efficiently couple the heat energy from the radiant energy source to the wafer. RTP has been utilized in a number of different semiconductor processing steps including nitridation, oxidation, dopant activation, silicide formation, and ion implantation damage removal. RTP processors have also been used in rapid thermal chemical vapor deposition (RTCVD) processes.

Two major design considerations in RTP are temperature control and production time. Efficient coupling of the radiant heat from the lamps to the wafer is necessary so that large increases in wafer temperature can be produced in a short time. Moreover, in producing the rapid increase in wafer temperature, a uniform temperature distribution must be provided across the wafer. Lack of uniformity can produce excessive microelectronic device variation across the wafer or may render the wafer unuseable because of internal crystalline dislocation or even wafer cracking. The temperature across the wafer is also difficult to control, especially during the ramp up stage when the lamps are activated. Further, production time is increased as the RTP processor must ramp up to the desired temperature and ramp down once the process step is complete. This time for ramping up and ramping down, while still much less than with prior art furnaces, increases production time and reduces the throughput of the process.

Accordingly, there is a need for a method of processing semiconductor devices in which the processing temperature may be easily and readily controlled. There is a further need for such a method which may be used in a variety of temperature and pressure environments. Preferably, such a method would decrease production time and increase the throughput of the process. Preferably, such a method would be relatively inexpensive and easy to perform.

SUMMARY OF THE INVENTION

The present invention meets this need by providing a method in which a predetermined amount of power is applied to the radiant heat sources in an RTP chamber prior to inserting the wafer to be processed into the chamber. The predetermined amount of power is set so that the wafer reaches the desired processing temperature quickly without the typical ramp up time. The predetermined amount of power remains constant before, during, and after processing such that there is also no ramp down of power associated with the process. The production time of the process is thus reduced. A reflective plate may be positioned within the chamber so that the radiated properties of the wafer are substantially independent of the emissivity of the wafer thereby minimizing wafer to wafer variation. Emissivity variation may also be minimized by positioning the wafer near a plate within the chamber so as to form an isothermal cavity between the wafer and the plate.

According to a first aspect of the present invention, a method of manufacturing semiconductor wafers in a processing chamber having at least one radiant heat source is provided. A predetermined amount of power is provided to the radiant heat source and a wafer is then positioned within the processing chamber. The predetermined amount of power applied to the radiant heat source is set so that the wafer reaches a predetermined temperature in a predetermined amount of time for carrying out a desired process in the processing chamber.

The radiant heat source may comprise a tungsten-halogen lamp. The pressure within the processing chamber during the desired process is greater than approximately $1 \times 10^{-10}$ torr, and preferably, less than approximately 100 mtorr. The pressure within the processing chamber may be less than approximately 15,200 torr. The predetermined amount of time is less than approximately 10 seconds. Preferably, the predetermined amount of power remains substantially constant during the desired process.

According to another aspect of the present invention, a method of manufacturing semiconductor wafers in a processing chamber having at least one radiant heat source and at least one reflective plate is provided. A predetermined amount of power is applied to the radiant heat source and a first wafer having a first emissivity is positioned within the processing chamber such that the radiated properties of the first wafer are substantially independent of the first emissivity. The predetermined amount of power applied to the radiant heat source is set such that the first wafer reaches a predetermined temperature in a predetermined amount of time for carrying out a desired process in the processing chamber.

The method may comprise the step of positioning a second wafer having a second emissivity different from the first emissivity within said processing chamber such that the radiated properties of the second wafer are substantially independent of the second emissivity. An effective emissivity of the first wafer is approximately the same as an effective emissivity of the second wafer. Preferably, the reflective plate has an emissivity greater than approximately 0.6. A distance between the first wafer and the reflective plate is less than approximately 10 cm, and preferably, less than approximately 1 cm. Preferably, the pressure within the processing chamber is less than approximately 100 mtorr. The predetermined amount of power preferably remains substantially constant during the desired process.

According to yet another aspect of the present invention, a method of manufacturing semiconductor wafers in a processing chamber having at least one radiant heat source and at least one plate is provided. A predetermined amount of power is applied to the radiant heat source and a wafer is then positioned within the processing chamber such that an isothermal cavity is formed between the wafer and the plate. The predetermined amount of power applied to the radiant heat source is set so that the wafer reaches a predetermined temperature in a predetermined amount of time for carrying out a desired process in the processing chamber.

Preferably, a distance between the plate and the wafer is approximately 1–10 mm. Preferably, the plate comprises material selected from the group consisting of graphite, silicon, silicon carbide and carbon. The pressure within the processing chamber is preferably greater than approximately 1 mtorr. Preferably, the predetermined amount of power remains substantially constant during the desired process.

According to a further aspect of the present invention, a method of manufacturing semiconductor wafers in a cluster system having at least a first processing chamber and at least a second processing chamber is provided. Each of the first and second processing chambers include at least one radiant heat source positioned therein. The cluster system is maintained in a controlled ambient environment. The method comprises applying a first predetermined amount of power to the radiant heat source in the first processing chamber, applying a second predetermined amount of power to the radiant heat source in the second processing chamber, positioning a first wafer having a first emissivity within the first processing chamber so as to perform a first process, and positioning the first wafer within the second processing chamber so as to perform a second process. The first predetermined amount of power applied to the radiant heat source in the first processing chamber is set such that the first wafer reaches a first predetermined temperature in a first predetermined amount of time for carrying out the first process and the second predetermined amount of power applied to the radiant heat source in the second processing chamber is set such that the first wafer reaches a second predetermined temperature in a second predetermined amount of time for carrying the second process.

The first processing chamber may be different from the second processing chamber. The process may further comprise the step of transporting the first wafer from the first processing chamber to the second processing chamber in the controlled ambient environment. Preferably, the controlled ambient environment is substantially free of oxygen. The controlled ambient environment may be a vacuum or an $N_2$ purged ambient maintained around the wafer during the transporting step. At least one of the first and second processing chambers may include at least one reflective plate positioned so that the radiated properties of the first wafer are substantially independent of the first emissivity. The method may further comprise the step of positioning a second wafer having a second emissivity different from the first emissivity within the one of the first and second chambers so that the radiated properties of the second wafer are substantially independent of the second emissivity. The effective emissivity of the second wafer is approximately the same as the effective emissivity of the first wafer. Preferably, the second wafer is positioned within the respective chamber after the first or second process is performed on the first wafer. At least one of the first and second processing chambers may include at least one plate positioned so as to form an isothermal cavity between the wafer and the plate. Preferably, the first and second predetermined amounts of power remain substantially constant during the first and second processes, respectively.

According to a still further aspect of the present invention, a method of forming hemispherical grained silicon (HSG) is provided. A layer of starting material is formed on a wafer in a first process. The layer of starting material is seeded with a seed material in a second process. The wafer is annealed in a third process. At least one of the second and third processes is carried out in a processing chamber having at least one radiant heat source positioned therein. A predetermined amount of power is applied to the processing chamber prior to positioning the wafer in the processing chamber so that the wafer reaches a predetermined temperature in a predetermined amount of time for carrying out the respective process.

Preferably, the second process is carried out in the processing chamber at a predetermined temperature of approximately 100 to 1000° C., a pressure less than approximately 10 torr, and a gas flow rate approximately 1 sccm to 10 slm. Preferably, the third process is carried out in the processing chamber at a predetermined temperature of approximately 200 to 1500° C., and a pressure less than approximately 760 torr. Preferably, the predetermined amount of power remains substantially constant during the respective process. Preferably, at least the second and third processes are carried out in a controlled ambient environment so that as the wafer is maintained in the controlled ambient environment between processes.

The other of the second and third processes is preferably carried out in a second processing chamber having at least one radiant heat source positioned therein. A second predetermined amount of power is applied to the second processing chamber prior to positioning the wafer in the second processing chamber so that the wafer reaches a second predetermined temperature in a second predetermined amount of time for carrying out the respective process. Preferably, the processing chamber is different from the second processing chamber. The method may further comprise the step of transporting the wafer from the processing chamber to the second processing chamber in a controlled ambient environment. Preferably, the another predetermined amount of power remains substantially constant during the respective process.

The method may further comprise the step of cleaning the wafer prior to performing at least one of the second and third processes. The step of cleaning the wafer prior to performing at least one of the second and third processes may be carried out in the processing chamber or another processing chamber at a predetermined temperature of approximately 10 to 200° C. The method may further comprise a plurality of the processing chambers for carrying out each of the first, second and third processes. Preferably, the plurality of chambers are maintained in a controlled ambient environment. The method may further comprise the step of forming a dielectric layer above the annealed layer.

According to yet another aspect of the present invention, a method of forming HSG is provided in which a layer of starting material is formed on a first wafer in a first process. The layer of starting material is seeded with a seed material in a second process and the first wafer is annealed in a third process. At least one of the second and third processes is carried out in a processing chamber having at least one radiant heat source and at least one reflective plate positioned therein. The first wafer has a first emissivity such that when the first wafer is positioned in the processing chamber the radiated properties of the first wafer are substantially independent of the first emissivity. A predetermined amount of power is applied to the processing chamber prior to positioning the first wafer in the processing chamber so that the first wafer reaches a predetermined temperature in a predetermined amount of time for carrying out the respective process.

According to a further aspect of the present invention, a method of forming HSG is provided in which a layer of starting material is formed on a wafer in a first process. The layer of starting material is seeded with a seed material in a second process and the wafer is annealed in a third process. At least one of the second and third processes is carried out in a processing chamber having at least one radiant heat source and at least one plate positioned therein. The wafer is positioned in the processing chamber such that an isothermal cavity is formed between the wafer and the plate. A predetermined amount of power is applied to the processing chamber prior to positioning the wafer in the processing chamber so that the wafer reaches a predetermined temperature in a predetermined amount of time for carrying out the respective process.

According to a still further aspect of the present invention, a method of forming HSG is provided in which a layer of starting material is formed on a first wafer having a first emissivity in a first process. The layer of starting material is seeded with a seed material in a second process. The second process is carried out in a first processing chamber having at least a first radiant heat source positioned therein with a first predetermined amount of power being applied to the first radiant heat source prior to positioning the first wafer in the first processing chamber so that the first wafer reaches a first predetermined temperature in a first predetermined amount of time for carrying out the second process. The first wafer is annealed in a third process. The third process is carried out in a second processing chamber having at least a second radiant heat source positioned therein with a second predetermined amount of power being applied to the second radiant source prior to positioning the first wafer in the second processing chamber so that the first wafer reaches a second predetermined temperature in a second predetermined amount of time for carrying out the third process. The first wafer is transported from the first processing chamber to the second processing chamber in a controlled ambient environment.

Preferably, the first and second processing chambers form part of a cluster system. The method may further comprise the step of cleaning the first wafer prior to performing one of the second and third processes. The step of cleaning the first wafer prior to performing one of the second and third processes is carried out in a cleaning chamber with the cleaning chamber forming part of the cluster system.

According to another aspect of the present invention, a method of forming HSG is provided in which a layer of starting material is formed on a wafer in a first process. The layer of starting material is seeded with a seed material in a second process. The second process is carried out in a first processing chamber having at least a first radiant heat source positioned therein. A first predetermined amount of power is applied to the first radiant heat source prior to positioning the wafer in the first processing chamber so that the wafer reaches a first predetermined temperature in a first predetermined amount of time for carrying out the second process. The wafer is annealed in a third process. The third process is carried out in a second processing chamber having at least a second radiant heat source positioned therein. A second predetermined amount of power is applied to the second radiant source prior to positioning the wafer in the second processing chamber so that the wafer reaches a second predetermined temperature in a second predetermined amount of time for carrying out the third process. A dielectric layer is formed over the annealed layer in a fourth process. The fourth process is carried out in a third processing chamber having at least a third radiant heat source positioned therein. A third predetermined amount of power is applied to the third radiant source prior to positioning the wafer in the third processing chamber so that the wafer reaches a third predetermined temperature in a third predetermined amount of time for carrying out the fourth process. The wafer is transported between the processing chambers in a controlled ambient environment with the first, second and third processing chambers forming part of a cluster system.

Accordingly, it is an object of the present invention to provide a method for processing semiconductors. It is a further object of the present invention to provide such a method in which the processing temperature may be easily and readily controlled. It is another object of the present invention to provide such a method which may be used in a variety of different temperature and pressure environments. It is yet another object of the present invention to provide such a method in which production time is decreased and throughput increased. It is still a further object of the present invention to provide such a method which is relatively inexpensive and easy to perform. Other features and advantages of the invention will be apparent from the following description, the accompanying drawings and the appended claims.

DETAILED DESCRIPTION OF THE PREFERRED EMBODIMENTS

Figure 1:
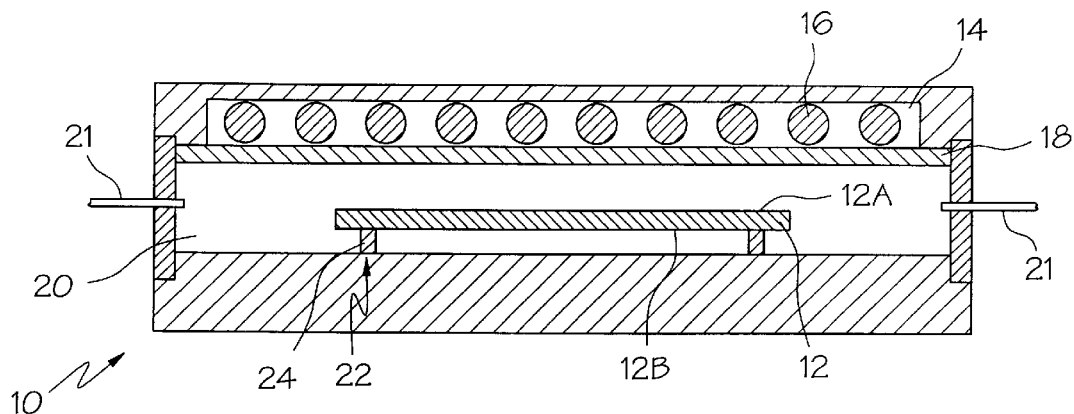
FIG. 1 is cross-sectional view of a processing chamber for carrying out a process according to a first aspect of the present invention.

Referring now to FIG. 1, a processing chamber 10 for carrying out desired processes on a wafer 12 is shown. In the illustrative embodiment, the processing chamber 10 is an RTP processor. The processing chamber 10 includes a radiant energy heating system 14 for heating the wafer 12 to a desired or predetermined temperature required for the desired process being carried out. The radiant energy heating system 14 comprises a plurality of radiant energy heat sources 16, such as tungsten-halogen lamps or high-powered arc lamps. In the illustrative embodiment, the heating system 14 is arranged for single-sided heating with the heat sources 16 positioned above or below the wafer 12. In either case, the heat sources are separated from the wafer 12 by a quartz window 18. In the illustrative embodiment, the wafer 12 and the heat sources 16 are arranged so that the heat sources 16 face a frontside 12A of the wafer 12.

The heat sources 16 may be arranged in any desired geometry. The four basic geometries which are typically used include a line source geometry, a square source geometry, a hexagonal source geometry and a ring source geometry. In the illustrative embodiment, the heat sources 16 comprise line symmetrical components, i.e., linear double-end tubes. The line source geometry comprises a parallel array of such line symmetrical components as shown in FIG. 1, while the square source geometry comprises a cross-lamp array having two or more parallel arrays positioned at an angle of approximately 90 degrees with respect to one another. The hexagonal source geometry includes one heat source positioned in the center and a plurality of other heat sources arranged in six hexagonal zones around it. The ring source geometry comprises an outer ring of heat sources, a middle ring of heat sources and an inner heat source or ring of heat sources. It will be appreciated by those skilled in the art that the above description of the arrangement and configuration of the heat sources is illustrative, and thus, may comprise other configurations and geometries.

The wafer 12 is positioned within a reaction chamber 20 and supported by a wafer holder 22 comprised of quartz or other suitable materials. In the illustrative embodiment, the wafer holder 22 includes a plurality of individual pins 24 on which a backside 12B of the wafer 12 is supported. The wafer holder 22 may also include a suitable device such as a clamping ring (not shown) to hold the wafer 12 in place as conditions of the particular process warrant. The processing chamber 10 also includes gas conduits 21 for pumping reactive and/or nonreactive gases through the reaction chamber 20. A vacuum pump (not shown) may also be used to evacuate the reaction chamber 10 as desired. The processing chamber 10 is configured to operate at temperatures as high as approximately 1200° C. and at pressures ranging from about $1 \times 10^{-10}$ torr to about atmospheric pressure or 760 torr. The processing chamber 10 may also be configured to operate at pressures as high as twenty atmospheres or 15,200 torr.

Prior to positioning the wafer 12 within the reaction chamber 20, a predetermined amount of power is applied to the heat sources 16. The predetermined amount of power is set based on the particular process being carried out in the processing chamber 10. With the heat sources 16 powered, the wafer 12 is positioned within the reaction chamber 20. The predetermined amount of power is set so that the wafer 12 reaches a predetermined temperature within a predetermined amount of time. The predetermined amount of time may range from 1 to 10 seconds based in part of the predetermined temperature. This predetermined amount of time, or stabilization period, is less than the corresponding ramp up period associated with conventional RTP processors. Further, the predetermined temperature is not necessarily the final steady state temperature of the wafer 12 but a temperature at which processing may be started. Temperature uniformity across the wafer 12 is improved as the wafer 12 is bought to the desired processing temperature quickly and faster than a process having a typical ramp up period. The desired process is then carried out on the wafer 12 with the wafer 12 being immediately removed from the reaction chamber 20. The predetermined amount of power remains constant before, during, and after processing, such that there is also no cool-down period associated with the desired process. Accordingly, the process or production time is lower than the conventional RTP process such that throughput is increased.

Operation of the processing chamber 10 in this manner increases repeatability of the process from one wafer to another. Variations in the characteristics of wafers processed in the same processing chambers is directly related to temperature control and temperature variations across the wafer during ramp up to processing temperature and ramp down. As the predetermined amount of power remains constant during the entire process of the present invention, there is no ramp up or ramp down to cause temperature variations across the wafers as experienced in the prior art.

Further, temperature control is simplified as the heat sources 16 are run at the predetermined amount of power during the entire process. It is not necessary to adjust the power for ramp up and ramp down as in the prior art. Accordingly, the predetermined amount of power is set so that the process being carried out is optimized. The predetermined amount of power for each particular process may be set through trial and error on test wafers, computer simulation or any other suitable method. In addition, precise temperature measurements are not required as the predetermined amount of power is set so as to bring the wafers 20 to the predetermined temperature quickly for processing. It will be appreciated by those skilled in the art that any appropriate semiconductor processing may be carried out in the processing chamber 10.

Figure 2:
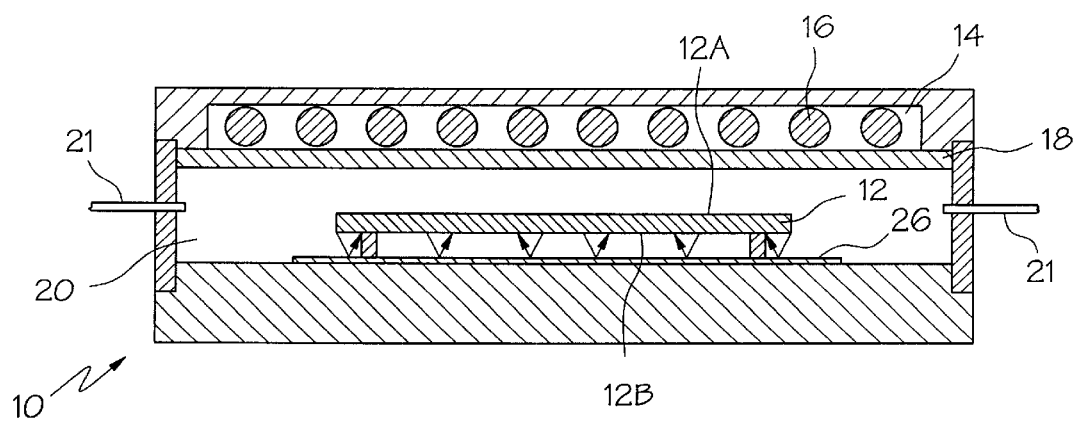
FIG. 2 is cross-sectional view of a processing chamber for carrying out a process according to a second aspect of the present invention.

Referring now to FIG. 2, with like reference numerals referring to like elements, the radiated properties of the wafer 12 may be substantially independent of the emissivity of the wafer 12 using a reflective plate 26 positioned adjacent to the backside 12B of the wafer 12. The reflective plate 26 has a high emissivity of at least 0.6. The reflective plate 26 is positioned so that the radiated properties of the wafer 12 are substantially independent of the emissivity of the wafer 12. The reflective plate 26 is positioned in relative close proximity to the wafer 12, less than approximately 10 cm. Preferably, the distance between the reflective plate 26 and the wafer 12 is less than approximately 1 cm. As with all structures, radiation is absorbed and emitted from the wafer 12. It is to be understood that as emissivity is dependent on wavelength and temperature, references to emissivity herein are made with respect to the same wavelength and temperature as appropriate.

While the wafer 12 absorbs radiation from the heat sources 16, it also emits radiation, some of which is reflected from the reflective plate 26 back to the wafer 12 to further heat the wafer 12. Radiation is thus reflected back and forth between the reflective plate 26 and the wafer 12 such that any differences between the frontside 12A and the backside 12B of the wafer affecting temperature are minimized. The wafer 12 has a first or set emissivity based on its structural configuration, i.e. the size, number and materials making up the wafer 12. The emissivity of the wafer 12 is driven to a constant such that the constant predetermined amount of power applied to the heat sources will not result in different heat loss between the frontside 12A and the backside 12B of the wafer 12. The temperature uniformity across the wafer 12 is therefore improved as the wafer 12 is processed in a pseudo ambient temperature condition.

Further, as the radiated properties of the wafer 12 are independent of the emissivity of the wafer 12, the reflective plate 26 enhances the effective emissivity of wafers having different set emissivities to approximately the same value. A second wafer having a second emissivity different from the first emissivity positioned within the reaction chamber 20 adjacent to the reflective plate 26 will have radiated properties substantially independent of the second emissivity. Therefore, an effective emissivity of the second wafer is substantially equal to the effective emissivity of the first wafer 12 similarly positioned. Accordingly, wafer to wafer variations are reduced as the effective emissivity from one wafer to another is substantially the same regardless of the set emissivities of the wafers. This enhanced effective emissivity allows for improved wafer to wafer temperature control, and thus, improved uniformity between the wafers. Improved uniformity between wafers means the process is repeatable from wafer to wafer, i.e., wafer to wafer repeatability.

Figure 3:
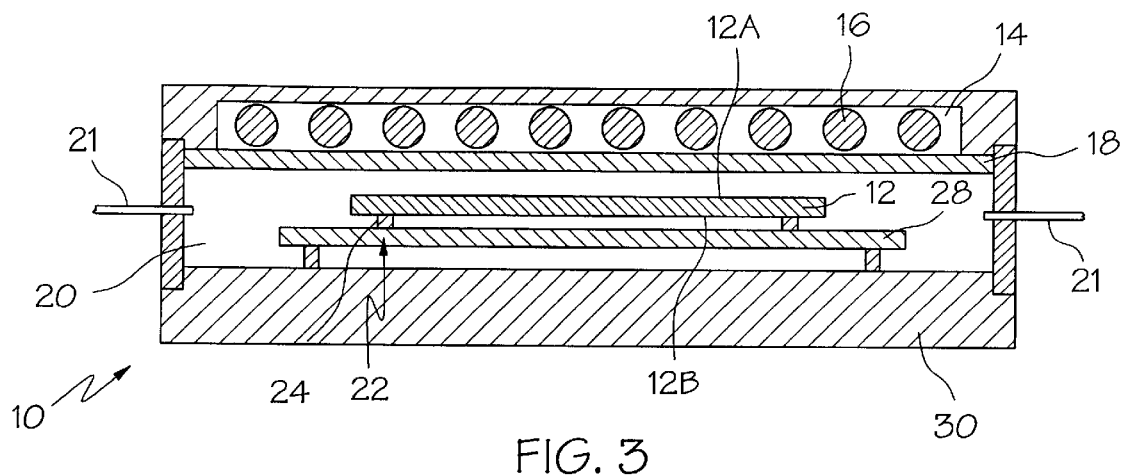
FIG. 3 is cross-sectional view of a processing chamber for carrying out a process according to a third aspect of the present invention.

Referring now to FIG. 3, with like reference numerals referring to like elements, emissivity variation between wafers may be minimized using a plate 28 positioned adjacent to the backside 12B of the wafer 12. The plate 28 is positioned so that there is a gap between the bottom side of the plate 28 and the lower chamber wall 30. It will be appreciated by those skilled in the art that the plate 28 may be positioned directly on the chamber wall 30. The plate 28 is positioned so as to form an isothermal cavity between the wafer 12 and the plate 28. The plate 28 is comprised of material selected from the group consisting of graphite, silicon, silicon carbide and carbon. It will be appreciated by those skilled in the art that the plate 28 may be formed from other appropriate materials or composites thereof. To form the isothermal cavity, the distance between the wafer 12 and the plate 28 is approximately 1 to 10 mm and the pressure within the reaction chamber 20 is at least 1 mtorr. The plate 28 reaches the predetermined temperature for processing prior to wafer insertion as the heat sources 16 are constantly receiving the predetermined amount of power. Once the wafer 12 is inserted into the reaction chamber 20, the isothermal cavity is created between the wafer 12 and the plate 28 thereby making the temperature across the wafer 12 uniform. Temperature control between wafers is improved thereby leading to improved wafer uniformity and wafer to wafer repeatability.

The above method may be used to perform any desired semiconductor manufacturing process. The method may also be used in one or more different process steps using one or more different processing chambers 10. If different processing chambers 10 are used, the heat sources 16 in each processing chamber 10 are set to the predetermined amount of power required for the process to be performed in that chamber 10. The predetermined amount of power to each chamber 10 remains substantially constant during the entire process. However, if the number of processes is greater than the number of processing chambers, the power to the processing chambers 10 will have to be adjusted between affected processes. Accordingly, the heat sources 16 will receive a first predetermined amount of power for a first process and a second predetermined amount of power for a second process. It should be apparent that the particular predetermined amount of power for the particular process will be set and applied to the heat sources 16 prior to inserting the wafer 12 into the processing chamber 10. The particular predetermined amount of power will also remain substantially constant during the particular process.

Figure 4:
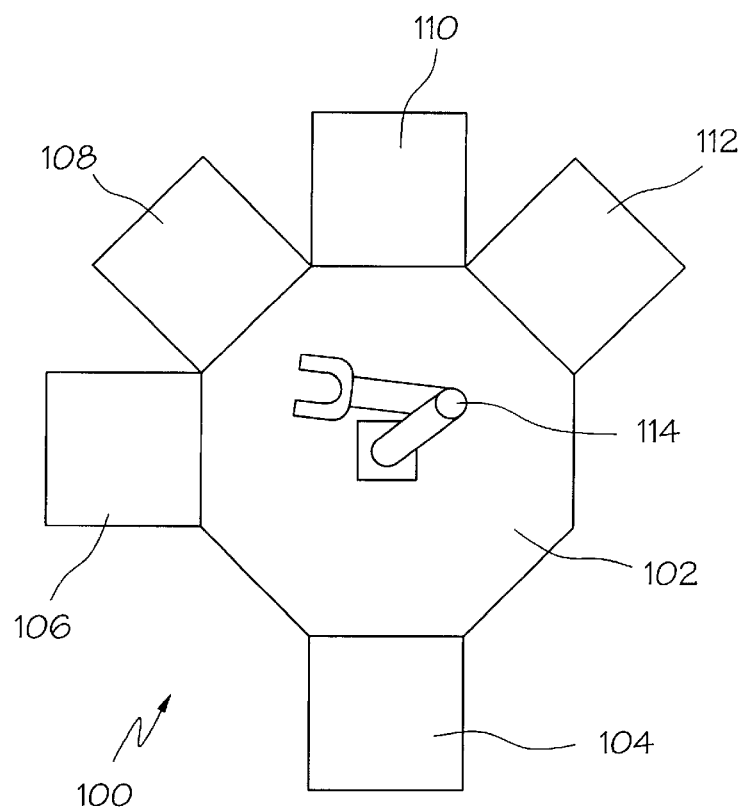
FIG. 4 is plan view of a cluster system having one or more of the processing chambers in FIGS. 1, 2 and 3.

The method may be used to form hemispherical grained silicon (HSG) according to the process set forth in U.S. Pat. No. 5,634,974, issued to Weimer et al., on Jun. 3, 1997, the disclosure of which is hereby incorporated by reference. Referring now to FIG. 4, the method of forming HSG will be described using a cluster system 100. It should be apparent that other semiconductor processing may also be performed in the cluster system 100. The cluster system 100 comprises a wafer handling chamber 102, a loading chamber 104, a cleaning chamber 106, a first processing chamber 108, a second processing chamber 110 and a third processing chamber 112. Each of the processing chambers 106, 108, 110 and 112 includes one or more heat sources 16, and optionally, one or more reflector plates 26, or one or more plates 28. The wafer handling chamber 102 includes a robotic arm 114 for transferring wafers between chambers. A controlled ambient environment is maintained within the wafer handling chamber 102 to prevent the formation of native oxides as the wafer 12 is transferred between the chambers in the cluster system 100. The controlled ambient environment may comprise a vacuum environment, an $N_2$ purged environment or other appropriate environments so that the wafer 12 is not exposed to the atmosphere or oxygen.

In the illustrated embodiment, a layer of starting material is formed on the wafer 12 using a first process prior to insertion into the cluster system 100. The starting material may include doped amorphous silicon (a-Si), undoped A—Si, porous A—Si, polycrystalline silicon (polysilicon) or other appropriate starting materials. The first process for forming the starting material may include plasma enhanced chemical vapor deposition (PECVD), low pressure chemical vapor deposition (LPCVD), or rapid thermal chemical vapor deposition (RTCVD). It will be appreciated by those skilled in the art that the starting material may be formed within the cluster system 100 using an appropriate processing chamber according to the present invention.

Once the starting material has been formed on the wafer 12, the wafer 12 is transferred to the cluster system 100 through the wafer handling chamber 102. The wafer 12 is then transferred from the wafer handling chamber 102 to the cleaning chamber 106. A thin layer of native oxide grows over the starting material due to exposure to oxygen in the air. The thin layer of native oxide is removed using a cleaning process in the cleaning chamber 106. The cleaning process may include plasma or HF vapor cleaning. When HF vapor cleaning is used, a predetermined amount of power is applied to the heat sources 16 in the cleaning chamber 106 prior to wafer insertion. The predetermined amount of power is set so that the cleaning process is carried out at a temperature ranging from about 10 to 200° C. The pressure within the cleaning 106 chamber is at least approximately 1 mtorr. Optionally, methanol vapor can be added to the cleaning chamber 106 to act as a catalyst to facilitate control of the cleaning process. It will be appreciated by those skilled in the art that the cleaning process and the cleaning chamber 106 may be omitted by preventing the growth of the native oxide in the first place by transferring the wafer 16 to the cluster system 100 in a vacuum environment or a purged environment, i.e. an $N_2$ purged environment.

Once the native oxide is removed, the wafer 12 is transferred from the cleaning chamber 106 to the first processing chamber 108 using the arm 114. The starting material is seeded in the first processing chamber 108 using a second process. The starting material is preferably selectively seeded using a seeding material. In the illustrated embodiment, the seeding material includes a hydride, such as silane ($SiH_2$), disilane ($Si_2H_6$) or dichlorosilane ($SiH_2Cl_2$). The second process includes forming a layer of the seeding material over the starting material using PECVD, LPCVD, RTCVD, physical vapor deposition (PVD), or other appropriate deposition methods. The predetermined amount of power to the heat sources 16 in the first processing chamber 108 is set so that the second process is carried out at a temperature of approximately 100 to 1000° C., and preferably, from approximately 550 to 650° C. The second process is also carried out at a pressure less than approximately 200 mtorr, and a gas flow rate of approximately 1 sccm to 10 slm, for a time period of approximately 1 second to 60 minutes. Preferably, the second process is carried out at a pressure less than 10 torr, and more preferably, between $1 \times 10^{-5}$ torr to 500 mtorr, and a gas flow rate of approximately 10 to 100 sccm, for a time period of approximately 5 to 100 seconds.

Once the starting material is seeded, the wafer 12 is transferred from the first processing chamber 108 to the second processing chamber 110 by the robotic arm 114. The wafer 12 is annealed in the second processing chamber 110 using a third process to form the HSG. The predetermined amount of power to the heat sources 16 in the second processing chamber 110 is set so that the third process is carried out at a temperature of approximately 200 to 1500° C., and preferably, from approximately 550 to 650° C. The ambient within the second processing chamber is preferably inert. The second process is also carried out at a pressure of approximately $10^{-8}$ torr to 760 torr for a time period approximately 1 second to 5 hours. Preferably, the second process is carried out at a pressure less than 500 mtorr for a time period of approximately 5 to 100 seconds. The starting material may be patterned after it is annealed and before it is subjected to further processing, depending upon on the application.

Once the wafer 12 is annealed and the HSG formed, the wafer 12 is transferred from the second processing chamber 110 to the third processing chamber 112 by the robotic arm 114. A layer of dielectric material is formed over the annealed layer using a fourth process. The predetermined amount of power to the heat sources 16 in the third processing chamber 114 is set so that the fourth process is carried out at an optimum predetermined temperature for a predetermined amount of time. Once the dielectric layer is formed, the wafer 12 is removed from the third processing chamber 112 by the arm 114. Additional processes may be carried out in the cluster system 100 as desired or the wafer may be transferred out of the cluster system 100 for further processing. Further, if an oxygen free environment is not maintained within the cluster system 100, the wafer 12 may need to be cleaned in the cleaning chamber 106 between processes as needed.

It will be appreciated by those skilled in the art that the cluster system 100 may be arranged to carry out any desired number of processes. Further, two or more processes may be carried out in the same processing chamber. For example, the second and third processes described above may be carried out in the first processing chamber 108. The second process is carried out with the predetermined amount of power to the heat sources 16 set for the second process. Once the second process is completed, the wafer 12 is removed from the first processing chamber 108 and the predetermined amount of power to the heat sources 16 is changed for the third process. The wafer 12 is then reinserted into the first processing chamber 108 and the third process is then carried out.

Having described the invention in detail and by reference to preferred embodiments thereof, it will be apparent that modifications and variations are possible without departing from the scope of the invention defined in the appended claims.

What is claimed is:

1. A method of manufacturing semiconductor wafers in a processing chamber having at least one radiant heat source, said method comprising the steps of:

applying a predetermined amount of power to said at least one radiant heat source; and positioning a wafer within said processing chamber;

wherein said predetermined amount of power applied to said at least one radiant heat source is set such that said wafer reaches a predetermined temperature in a predetermined amount of time for carrying out a desired process in said processing chamber.

2. The method of claim 1, wherein said at least one radiant heat source comprises a tungsten-halogen lamp.

3. The method of claim 1, wherein the pressure within said processing chamber during said desired process is greater than approximately $1 \times 10^{-10}$ torr.

4. The method of claim 1, wherein the pressure within said processing chamber is less than approximately 100 mtorr.

5. The method of claim 1, wherein the pressure within said processing chamber is less than approximately 15,200 torr.

6. The method of claim 1, wherein said predetermined amount of time is less than approximately 10 seconds.

7. The method of claim 1, wherein said predetermined amount of power remains substantially constant during said desired process.

8. A method of manufacturing semiconductor wafers in a processing chamber having at least one radiant heat source and at least one reflective plate, said method comprising the steps of:

applying a predetermined amount of power to said at least one radiant heat source; and positioning a first wafer having a first emissivity within said processing chamber such that the radiated properties of said first wafer are substantially independent of said first emissivity;

wherein said predetermined amount of power applied to said at least one radiant heat source is set such that said first wafer reaches a predetermined temperature in a predetermined amount of time for carrying out a desired process in said processing chamber.

9. The method of claim 8, further comprising the step of positioning a second wafer having a second emissivity different from said first emissivity within said processing chamber such that the radiated properties of said first wafer are substantially independent of said first emissivity.

10. The method of claim 9, wherein an effective emissivity of said first wafer is substantially equal to an effective emissivity of said second wafer.

11. The method of claim 8, wherein said reflective plate has an emissivity greater than approximately 0.6.

12. The method of claim 8, wherein a distance between said first wafer and said reflective plate is less than approximately 10 cm.

13. The method of claim 8, wherein a distance between said first wafer and said reflective plate is less than approximately 1 cm.

14. The method of claim 8, wherein the pressure within said processing chamber is less than approximately 100 mtorr.

15. The method of claim 8, wherein said predetermined amount of power remains substantially constant during said desired process.

16. A method of manufacturing semiconductor wafers in a processing chamber having at least one radiant heat source and at least one plate, said method comprising the steps of:

applying a predetermined amount of power to said at least one radiant heat source; and positioning a wafer within said processing chamber such that an isothermal cavity is formed between said wafer and said plate;

wherein said predetermined amount of power applied to said at least one radiant heat source is set such that said wafer reaches a predetermined temperature in a predetermined amount of time for carrying out a desired process in said processing chamber.

17. The method of claim 16, wherein a distance between said plate and said wafer is approximately 1–10 mm.

18. The method of claim 16, wherein said plate comprises material selected from the group consisting of graphite, silicon, silicon carbide and carbon.

19. The method of claim 16, wherein the pressure within said processing chamber is greater than approximately 1 mtorr.

20. The method of claim 16, wherein said predetermined amount of power remains substantially constant during said desired process.

21. A method of manufacturing semiconductor wafers in a cluster system having at least a first processing chamber and at least a second processing chamber, each of said first and second processing chambers having at least one radiant heat source positioned therein, said cluster system being maintained in a controlled ambient environment, said method comprising the steps of:
applying a first predetermined amount of power to said at least one radiant heat source in said first processing chamber;
applying a second predetermined amount of power to said at least one radiant heat source in said second processing chamber;
positioning a first wafer having a first emissivity within said first processing chamber so as to perform a first process; and
positioning said first wafer within said second processing chamber so as to perform a second process;
wherein said first predetermined amount of power applied to said at least one radiant heat source in said first processing chamber is set such that said first wafer reaches a first predetermined temperature in a first predetermined amount of time for carrying out said first process, and wherein said second predetermined amount of power applied to said at least one radiant heat source in said second processing chamber is set such that said first wafer reaches a second predetermined temperature in a second predetermined amount of time for carrying said second process.

22. The method of claim 21, wherein said first processing chamber is different from said second processing chamber.

23. The method of claim 21, further comprising the step of transporting said first wafer from said first processing chamber to said second processing chamber in said controlled ambient environment.

24. The method of claim 23, wherein said controlled ambient environment is substantially free of oxygen.

25. The method of claim 23, wherein said controlled ambient environment is a vacuum maintained around said first wafer during said transporting step.

26. The method of claim 23, wherein said controlled ambient environment is an $N_2$ purged ambient maintained around said first wafer during said transporting step.

27. The method of claim 21, wherein at least one of said first and second processing chambers includes at least one reflective plate positioned such that the radiated a properties of said first wafer are substantially independent of said first emissivity.

28. The method of claim 27, further comprising the step of positioning a second wafer having a second emissivity different from said first emissivity within said one of said first and second chambers such that the radiated properties of said second wafer are substantially independent of said second and an effective emissivity of said first wafer is substantially equal to an effective emissivity of said second wafer.

29. The method of claim 28, wherein said step of positioning a second wafer having a second emissivity different from said first emissivity within said one of said first and second chambers is carried out after said first or second process is performed on said first wafer in said one of said first and second chambers.

30. The method of claim 21, wherein at least one of said first and second processing chambers includes at least one plate positioned so as to form an isothermal cavity between said first wafer and said plate.

31. The method of claim 21, wherein said first and second predetermined amounts of power remain substantially constant during said first and second processes, respectively.

32. A method of forming hemispherical grained silicon (HSG) comprising the steps of:
forming a layer of starting material on a wafer in a first process;
seeding said layer of starting material with a seed material in a second process; and
annealing said wafer in a third process;
wherein at least one of said second and third processes is carried out in a processing chamber having at least one radiant heat source positioned therein, and wherein a predetermined amount of power is applied to said processing chamber prior to positioning said wafer in said processing chamber so that said wafer reaches a predetermined temperature in a predetermined amount of time for carrying out the respective process.

33. The method of claim 32, wherein said second process is carried out in said processing chamber and said predetermined temperature is approximately 100 to 1000° C.

34. The method of claim 33, wherein the pressure within said processing chamber is less than approximately 10 torr.

35. The method of claim 33, wherein a gas flow rate within said processing chamber is approximately 1 sccm to 10 slm.

36. The method of claim 32, wherein said third process is carried out in said processing chamber and said predetermined temperature is approximately 200 to 1500° C.

37. The method of claim 36, wherein the pressure within said processing chamber is less than approximately 760 torr.

38. The method of claim 32, wherein said predetermined amount of power remains substantially constant during said respective process.

39. The method of claim 32, wherein at least said second and third processes are carried out in a controlled ambient environment such that said wafer is maintained in said controlled ambient environment between said second process and said third process.

40. The method of claim 32, wherein the other of said second and third processes is carried out in a second processing chamber having at least one radiant heat source positioned therein, and wherein a second predetermined amount of power is applied to said second processing chamber prior to positioning said wafer in said second processing chamber so that said wafer reaches a second predetermined temperature in a second predetermined amount of time for carrying out the respective process.

41. The method of claim 40, wherein said processing chamber is different from said second processing chamber.

42. The method of claim 40, further comprising the step of transporting said wafer from said processing chamber to said second processing chamber in a controlled ambient environment.

43. The method of claim 40, wherein said another predetermined amount of power remains substantially constant during said respective process.

44. The method of claim 32, further comprising the step of cleaning said wafer prior to performing at least one of said second and third processes.

45. The method of claim 44, wherein said step of cleaning said wafer prior to performing at least one of said second and third processes is carried out in said processing chamber, and wherein said predetermined temperature is approximately 10 to 200° C.

46. The method of claim 44, wherein said step of cleaning said wafer prior to performing at least one of said second and third processes is carried out in another processing chamber, and wherein said predetermined temperature is approximately 10 to 200° C.

47. The method of claim 32, further comprising a plurality of said processing chambers for carrying out each of said first, second and third processes.

48. The method of claim 47, wherein said plurality of processing chambers are maintained in a controlled ambient environment such that said wafer is maintained in said controlled ambient environment between processes.

49. The method of claim 32, further comprising the step of forming a dielectric layer above said annealed layer.

50. A method of forming HSG comprising the steps of:
forming a layer of starting material on a first wafer in a first process;
seeding said layer of starting material with a seed material in a second process; and
annealing said first wafer in a third process;
wherein at least one of said second and third processes is carried out in a processing chamber having at least one radiant heat source and at least one reflective plate positioned therein, said first wafer having a first emissivity such that when said first wafer is positioned in said processing chamber the radiated properties of said first wafer are substantially independent of said first emissivity, and wherein a predetermined amount of power is applied to said processing chamber prior to positioning said first wafer in said processing chamber so that said first wafer reaches a predetermined temperature in a predetermined amount of time for carrying out the respective process.

51. The method of claim 50, wherein said method is carried out on a second wafer having a second emissivity different from said first emissivity such that the radiated properties of said second wafer are substantially independent of said second emissivity.

52. The method of claim 51, wherein an effective emissivity of said first wafer is substantially equal to an effective emissivity of said second wafer.

53. The method of claim 50, wherein said reflective plate has an emissivity greater than approximately 0.6.

54. The method of claim 50, wherein a distance between said first wafer and said reflective plate is less than approximately 10 cm.

55. The method of claim 50, wherein a distance between said first wafer and said reflective plate is less than approximately 1 cm.

56. The method of claim 50, wherein the pressure within said processing chamber is less than approximately 10 torr.

57. The method of claim 50, wherein said second process is carried out in said processing chamber and said predetermined temperature is approximately 100 to 1000° C.

58. The method of claim 50, wherein said predetermined amount of power remains substantially constant during said desired process.

59. The method of claim 50, wherein at least said second and third processes are carried out in a controlled ambient environment such that said first wafer is maintained in said controlled ambient environment between said second process and said third process.

60. A method of forming HSG comprising the steps of:
forming a layer of starting material on a wafer in a first process;
seeding said layer of starting material with a seed material in a second process; and
annealing said wafer in a third process;
wherein at least one of said second and third processes is carried out in a processing chamber having at least one radiant heat source and at least one plate positioned therein, said wafer being positioned in said processing chamber such that an isothermal cavity is formed between said wafer and said plate, and wherein a predetermined amount of power is applied to said processing chamber prior to positioning said wafer in said processing chamber so that said wafer reaches a predetermined temperature in a predetermined amount of time for carrying out the respective process.

61. The method of claim 60, wherein a distance between said plate and said wafer is approximately 1–10 mm.

62. The method of claim 60, wherein said plate comprises material selected from the group consisting of graphite, silicon, silicon carbide and carbon.

63. The method of claim 60, wherein the pressure within said processing chamber is greater than approximately 1 mtorr.

64. The method of claim 60, wherein said predetermined amount of power remains substantially constant during said desired process.

65. A method of forming HSG comprising the steps of:
forming a layer of starting material on a first wafer having a first emissivity in a first process;
seeding said layer of starting material with a seed material in a second process, said second process being carried out in a first processing chamber having at least a first radiant heat source positioned therein, wherein a first predetermined amount of power is applied to said first radiant heat source prior to positioning said first wafer in said first processing chamber so that said first wafer reaches a first predetermined temperature in a first predetermined amount of time for carrying out said second process;
annealing said first wafer in a third process, said third process being carried out in a second processing chamber having at least a second radiant heat source positioned therein, wherein a second predetermined amount of power is applied to said second radiant source prior to positioning said first wafer in said second processing chamber so that said first wafer reaches a second predetermined temperature in a second predetermined amount of time for carrying out said third process; and
transporting said first wafer from said first processing chamber to said second processing chamber in a controlled ambient environment.

66. The method of claim 65, wherein said first and second processing chambers form part of a cluster system.

67. The method of claim 66, further comprising the step of cleaning said first wafer prior to performing at least one of said second and third processes.

68. The method of claim 67, wherein said step of cleaning said first wafer prior to performing at least one of said second and third processes is carried out in a cleaning chamber, said cleaning chamber forming part of said cluster system.

69. The method of claim 65, wherein said controlled ambient environment is substantially free of oxygen.

70. The method of claim 65, wherein said controlled ambient environment is a vacuum maintained around said first wafer during said transporting step.

71. The method of claim 65, wherein said controlled ambient environment is an $N_2$ purged ambient maintained around said first wafer during said transporting step.

72. The method of claim 65, wherein at least one of said first and second processing chambers includes at least one reflective plate positioned such that the radiated properties of said first wafer are substantially independent of said first emissivity.

73. The method of claim 72, wherein said method is carried out on a second wafer having a second emissivity different from said first emissivity such that the radiated properties of said second wafer are substantially independent of said second emissivity and an effective emissivity of said first wafer is substantially equal to an effective emissivity of said second wafer.

74. The method of claim 65, wherein at least one of said first and second processing chambers includes at least one plate positioned so as to form an isothermal cavity between said first wafer and said plate.

75. The method of claim 65, wherein said first and second predetermined amounts of power remain substantially constant during said second and third processes, respectively.

76. A method of forming HSG comprising the steps of:

forming a layer of starting material on a wafer in a first process;

seeding said layer of starting material with a seed material in a second process, said second process being carried out in a first processing chamber having at least a first radiant heat source positioned therein, wherein a first predetermined amount of power is applied to said first radiant heat source prior to positioning said wafer in said first processing chamber so that said wafer reaches a first predetermined temperature in a first predetermined amount of time for carrying out said second process;

annealing said wafer in a third process, said third process being carried out in a second processing chamber having at least a second radiant heat source positioned therein, wherein a second predetermined amount of power is applied to said second radiant source prior to positioning said wafer in said second processing chamber so that said wafer reaches a second predetermined temperature in a second predetermined amount of time for carrying out said third process;

forming a dielectric layer over said annealed layer in a fourth process, said fourth process being carried out in a third processing chamber having at least a third radiant heat source positioned therein, wherein a third predetermined amount of power is applied to said third radiant source prior to positioning said wafer in said third processing chamber so that said wafer reaches a third predetermined temperature in a third predetermined amount of time for carrying out said fourth process; and transporting said wafer between each of the chambers in a controlled ambient environment;

wherein said first, second and third processing chambers form part of a cluster system.

* * * * *